(12) United States Patent
Yamamoto et al.

(10) Patent No.: US 10,910,425 B2
(45) Date of Patent: Feb. 2, 2021

(54) SOLID-STATE IMAGE SENSOR

(71) Applicant: TOPPAN PRINTING CO., LTD., Taito-ku (JP)

(72) Inventors: Kazuto Yamamoto, Taito-ku (JP); Yo Sakata, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 0 days.

(21) Appl. No.: 16/432,504

(22) Filed: Jun. 5, 2019

(65) Prior Publication Data

US 2019/0312075 A1 Oct. 10, 2019

Related U.S. Application Data

(63) Continuation of application No. PCT/JP2017/043487, filed on Dec. 4, 2017.

(30) Foreign Application Priority Data

Dec. 5, 2016 (JP) .................... 2016-235840

(51) Int. Cl.
*H01L 27/146* (2006.01)
*G02B 5/10* (2006.01)
(Continued)

(52) U.S. Cl.
CPC .......... *H01L 27/14629* (2013.01); *G02B 5/10* (2013.01); *H01L 27/1464* (2013.01);
(Continued)

(58) Field of Classification Search
CPC ........... H01L 27/14629; H01L 27/1464; H01L 27/14627; H01L 27/14643; H01L 27/1463; H04N 9/07; H04N 5/369; G02B 5/10

See application file for complete search history.

(56) References Cited

U.S. PATENT DOCUMENTS

2011/0090384 A1 4/2011 Yamada
2013/0037727 A1\* 2/2013 Maeda .................. G01N 21/77
250/458.1
(Continued)

FOREIGN PATENT DOCUMENTS

JP 9-252103 A 9/1997
JP 2009-81201 A 4/2009
(Continued)

OTHER PUBLICATIONS

International Search Report dated Feb. 13, 2018 in PCT/JP2017/043487, filed Dec. 4, 2017, citing documents AQ, AR, and AS with English Translation.
(Continued)

*Primary Examiner* — Mohammed R Alam
(74) *Attorney, Agent, or Firm* — Oblon, McClelland, Maier & Neustadt, L.L.P.

(57) ABSTRACT

A solid-state image sensor including a semiconductor layer having a light incident side, a support substrate positioned on an opposite side of the light incident side of the semiconductor layer, photoelectric conversion elements formed two-dimensionally in the semiconductor layer, light reflection structures formed on a surface of the support substrate which faces toward the semiconductor layer, and positioned such that the light reflection structures face the photoelectric conversion elements, respectively, and an interlayer insulating layer formed between adjacent ones of the light reflection structures. The light reflection structures include a light transmission layer and a reflective metal that covers a surface of the light transmission layer opposite to a surface facing the semiconductor layer, and the reflective metal has a concave curved surface facing the photoelectric conversion elements.

20 Claims, 8 Drawing Sheets

(51) Int. Cl.
*H04N 9/07* (2006.01)
*H04N 5/369* (2011.01)

(52) U.S. Cl.
CPC ............... *H04N 5/369* (2013.01); *H04N 9/07* (2013.01); *H01L 27/1463* (2013.01); *H01L 27/14627* (2013.01); *H01L 27/14643* (2013.01)

(56) References Cited

U.S. PATENT DOCUMENTS

| | | | |
|---|---|---|---|
| 2014/0264505 A1* | 9/2014 | Chiu | H01L 27/14685 257/292 |
| 2016/0043125 A1* | 2/2016 | Hatano | H01L 27/14627 257/40 |
| 2017/0263661 A1* | 9/2017 | Ikeda | H01L 27/146 |
| 2018/0063456 A1* | 3/2018 | Lee | H01L 27/14645 |
| 2019/0081191 A1* | 3/2019 | Manda | H01L 31/0304 |
| 2019/0244992 A1* | 8/2019 | Yokogawa | H01L 27/14605 |

FOREIGN PATENT DOCUMENTS

| | | |
|---|---|---|
| JP | 2010-177705 A | 8/2010 |
| JP | 2011-91128 A | 5/2011 |
| JP | 2011-119484 A | 6/2011 |
| JP | 2014-86699 A | 5/2014 |
| JP | 2014-203961 A | 10/2014 |

OTHER PUBLICATIONS

Extended European Search Report dated Oct. 11, 2019, in Patent Application No. 17877628.2, citing document AO therein, 7 pages.

* cited by examiner

SOLID-STATE IMAGE SENSOR

CROSS-REFERENCE TO RELATED APPLICATIONS

The present application is a continuation of International Application No. PCT/JP2017/043487, filed Dec. 4, 2017, which is based upon and claims the benefits of priority to Japanese Application No. 2016-235840, filed Dec. 5, 2016. The entire contents of all of the above applications are incorporated herein by reference.

BACKGROUND OF THE INVENTION

Field of the Invention

The present invention relates to a solid-state image sensor.

Discussion of the Background

A solid-state image sensor is a device in which CMOS type or CCD type photoelectric conversion elements that absorb light and generate an electric charge are two-dimensionally arranged in a semiconductor layer and which transfers the generated electric charge as an electrical signal to the outside. Such a solid-state image sensor has widely been used in television cameras, digital still cameras, and the like.

The photoelectric conversion element in the solid-state image sensor is generally composed of a pn junction silicon photodiode. When a pn junction to which a reverse voltage is applied is irradiated with light, an electron generated in a depletion layer drifts in the depletion layer and reaches an n-type region. In the solid-state image sensor, imaging data can be obtained by reading, as signal charges, the electrons accumulated in the n-type region of the photodiode of each pixel.

Intensity of light incident on the photoelectric conversion element is rapidly attenuated as the light travels to an inside of the photoelectric conversion element, because the photons are absorbed by the semiconductor and generate electron-hole pairs. The ratio of absorption depends on an optical absorption coefficient. When penetrating the same distance, light having a longer wavelength has a lower ratio of absorption. This has caused a problem in which red light, which has a long wavelength, is not absorbed by the semiconductor and thus red light sensitivity is reduced.

A conventional technique disclosed in Patent Literature 1 is a back-side illuminated solid-state image sensor in which a metal reflective surface is formed on a back side of a photoelectric conversion element in order to reuse light in a long-wavelength region that has passed through the photoelectric conversion element.

Furthermore, a conventional technique disclosed in Patent Literature 2 is a structure in which a concave reflector formed on a back side of a semiconductor substrate enables red light that has passed through the semiconductor substrate to efficiently reenter a photoelectric conversion element.

Patent Literature 1 JP 2010-177705 A
Patent Literature 2 JP 2011-119484 A

SUMMARY OF THE INVENTION

According to an aspect of the present invention, a solid-state image sensor includes a semiconductor layer having a light incident side, a support substrate positioned on an opposite side of the light incident side of the semiconductor layer, photoelectric conversion elements formed two-dimensionally in the semiconductor layer, light reflection structures formed on a surface of the support substrate which faces toward the semiconductor layer, and positioned such that the light reflection structures face the photoelectric conversion elements, respectively, and an interlayer insulating layer formed between adjacent ones of the light reflection structures. The light reflection structures include a light transmission layer and a reflective metal that covers a surface of the light transmission layer opposite to a surface facing the semiconductor layer, and the reflective metal has a concave curved surface facing the photoelectric conversion elements.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
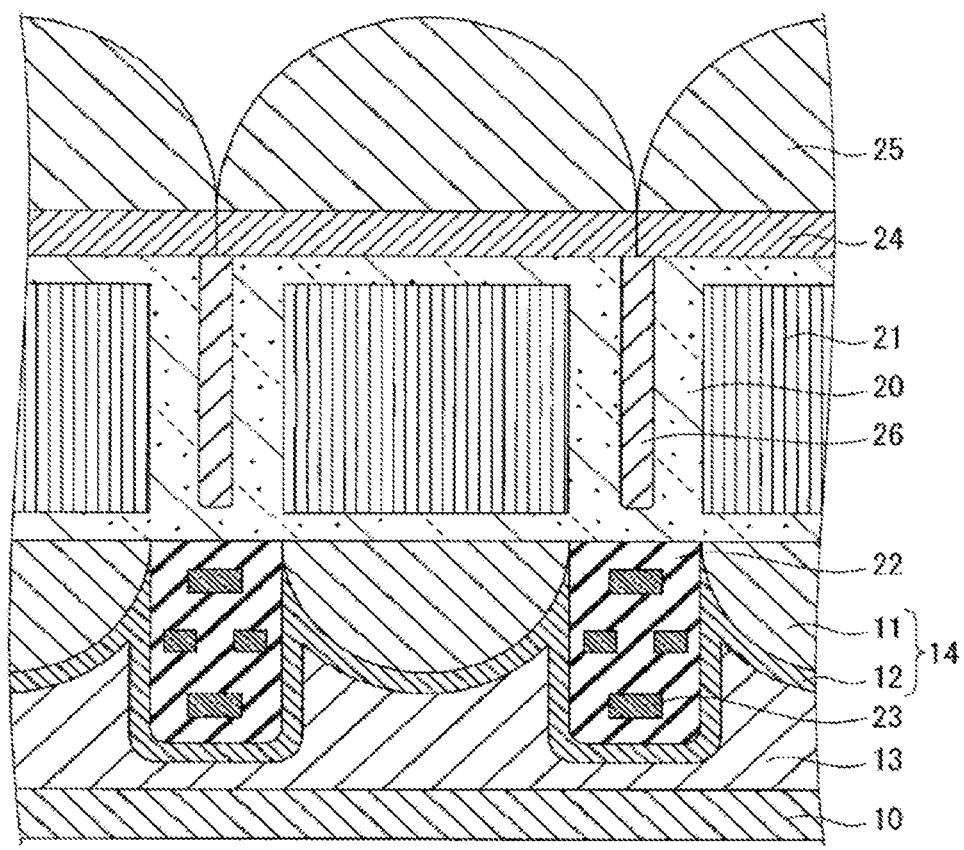
FIG. 1 is a schematic cross-sectional view illustrating a schematic structure of a solid-state image sensor according to one embodiment of the present invention.

The embodiments will now be described with reference to the accompanying drawings, wherein like reference numerals designate corresponding or identical elements throughout the various drawings.

An embodiment of the present invention will be described below with reference to the drawings.

The drawings are schematic, and thus a relationship between a thickness and a planar dimension, a ratio of thicknesses of layers, and the like differ from actual values. Furthermore, the embodiments described below show, as an example, a configuration for embodying a technical idea of the present invention. The technical idea of the present invention does not specify materials, shapes, structures, and the like of the components as below. Various changes may be made to the technical idea of the present invention within the technical scope of the claims.

<Configuration>

As illustrated in FIG. 1, a solid-state image sensor of the present embodiment includes a semiconductor layer 20 in which a plurality of photoelectric conversion elements 21 are two-dimensionally arranged, and further includes a color filter 24 and micro-lenses 25 arranged in this order on a light incident side (an upper side in FIG. 1) of the semiconductor layer 20. In the semiconductor layer 20, the plurality of photoelectric conversion elements 21 are separated for each pixel by an element separation wall 26.

Furthermore, the solid-state image sensor of the present embodiment includes a support substrate 10 on a back surface side (a surface side opposite to the light incident side) of the semiconductor layer 20, and the semiconductor layer 20 is supported by the support substrate 10. An interlayer insulating layer 22 and a plurality of light reflection structures 14 are provided on a surface (on a surface of the support substrate 10 which faces toward the semiconductor layer 20) side of the support substrate 10.

Specifically, a flattening layer 13 is provided on the surface of the support substrate 10, and a reflective metal 12 which is a film is provided so as to cover a surface of the flattening layer 13. A light transmission layer 11 and the interlayer insulating layer 22 are provided on the reflective metal 12. The reflective metal 12 does not need to be a film, and only needs to be configured such that a surface of the reflective metal 12 facing the photoelectric conversion elements 21 has concave curved surfaces facing the photoelectric conversion elements 21.

The light transmission layers 11 are provided at positions perpendicularly facing the respective photoelectric conversion elements 21, i.e., on a back surface side of the respective photoelectric conversion elements 21. A surface of the light transmission layer 11 on the side of the semiconductor layer 20 is a plane, and a surface of the light transmission layer 11 on a side of the support substrate 10 has hemispherical convex shapes facing the support substrate 10.

In the present embodiment, a portion of the reflective metal 12 facing the hemispherical convex surfaces of the light transmission layer 11 has hemispherical shapes extending along the hemispherical surfaces (spherical surfaces) of the light transmission layer 11. The hemispherical portions of the reflective metal 12 and the light transmission layer 11 constitute a light reflection structure 14 having hemispherical shapes. Thus, the light reflection structure 14 is arranged such that spherical surfaces of the hemispherical shapes face the back surface side (the side of the support substrate 10) and planes of the hemispherical shapes face the side of the semiconductor layer 20 (i.e., the light incident side).

The portion of the reflective metal 12 facing the hemispherical convex surfaces of the light transmission layer 11 only needs to have concave curved surfaces facing the photoelectric conversion elements 21, i.e., convex curved surfaces facing the support substrate 10. The shape of the above portions of the reflective metal 12 are not limited to the shape of the partial sphere, and may be a shape of a partial ellipse or the like.

The interlayer insulating layer 22 is arranged on a back surface side of each of the element separation walls 26, i.e., between adjacent ones of the light reflection structures 14. A wire 23 is arranged in the interlayer insulating layer 22.

<Effects and Others>

In the solid-state image sensor of the present embodiment, in light incident on the photoelectric conversion element 21, red light that has passed through the photoelectric conversion element 21 without being absorbed and has passed through the semiconductor layer 20 is reflected by the light reflection structure 14 provided on the back surface side of the photoelectric conversion element 21, and travels toward the photoelectric conversion element 21. As a result, the red light that has passed through the semiconductor layer 20 efficiently reenters the photoelectric conversion element 21, and thus the solid-state image sensor of the present embodiment has good red light sensitivity.

Furthermore, since the light reflection structure 14 has the concave curved surfaces facing the photoelectric conversion elements 21 such as hemispherical surfaces, light reflected by the spherical surfaces of the light reflection structure 14 (the hemispherical portions of the reflective metal 12) is efficiently reflected toward the photoelectric conversion elements 21 of a pixel that the light has entered. Thus, color mixture caused by entry of light into the photoelectric conversion element 21 of an adjacent pixel is less likely to occur.

Furthermore, in the solid-state image sensor of the present embodiment, the light reflection structures 14 are located between the semiconductor layer 20 and the support substrate 10. Accordingly, no functional elements for reflecting incident light need to be particularly formed on a back surface of the support substrate 10. Thus, the support substrate 10 may be directly disposed on a stage during a production process, and this facilitates handling of the support substrate 10 during formation of the solid-state image sensor.

The solid-state image sensor of the present embodiment is a back-side illuminated solid-state image sensor, and is usable as a solid-state image sensor such as a CMOS image sensor or a CCD image sensor.

<Production Method>

A method of producing the solid-state image sensor of the present embodiment illustrated in FIG. 1 will be described with reference to FIGS. 2 to 12. However, the present invention is not limited to these.

Figure 2:
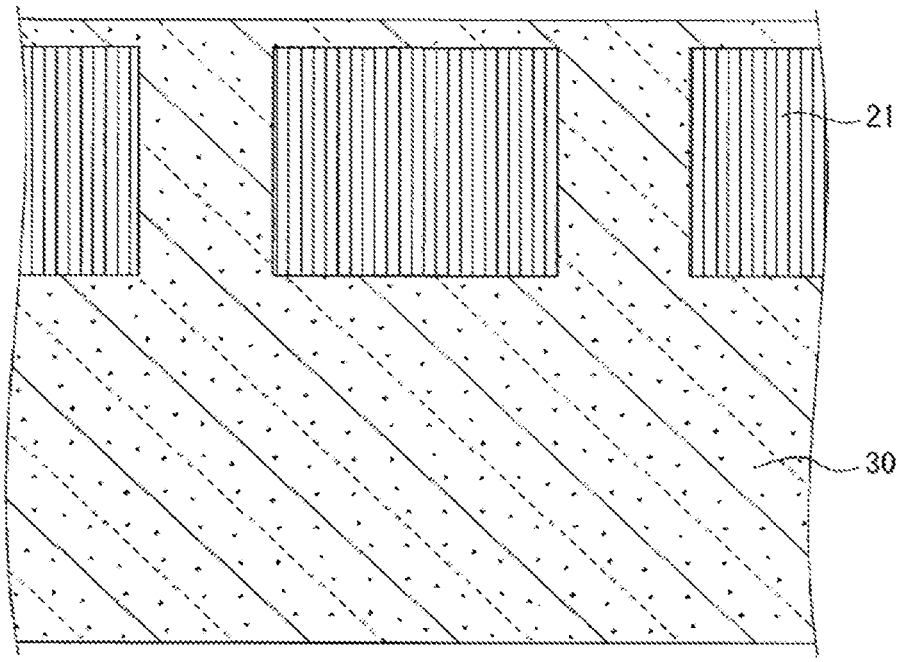
FIG. 2 is a schematic cross-sectional view illustrating a process of producing the solid-state image sensor according to one embodiment of the present invention.

First, as illustrated in FIG. 2, the photoelectric conversion element 21 is formed inside a semiconductor substrate 30 by a publicly known method. The semiconductor substrate 30 is a p-type or n-type silicon substrate for forming the semiconductor layer 20 in such a manner that, at a later step, the semiconductor substrate 30 is bonded to the support substrate 10 and then a semiconductor portion of the semiconductor substrate 30 is processed to be thin. An upper side in FIG. 2 is the back surface side of the photoelectric conversion element 21.

As the photoelectric conversion element 21, a photogate, a photodiode, or the like is used, but it is preferable to use a buried photodiode due to its high charge transfer rate. Although not illustrated, simultaneously with the formation of the photoelectric conversion element 21, an element necessary for driving the solid-state image sensor is formed in a pixel. For example, in the case of a CCD image sensor, a vertical transfer CCD is formed together with the photoelectric conversion element 21. On the other hand, in the case of a CMOS image sensor, elements such as a floating diffusion layer amplifier and a charge transfer transistor are formed together with the photoelectric conversion element 21.

After the formation of the photoelectric conversion element 21 and the other elements, a wire 23 for transferring a signal charge and a signal voltage or for driving the transistor is formed. Depending on a structure of the solid-state image sensor, a plurality of wires 23 are necessary, and thus the interlayer insulating layer 22 is formed between the wires 23 (see FIG. 3).

As a material of the interlayer insulating layer 22, a low dielectric constant material having transparency such as undoped silicon oxide is used. Furthermore, the interlayer insulating layer 22 is formed by a method such as atmospheric pressure CVD (Chemical Vapor Deposition) or PE-CVD (Plasma Enhanced-CVD), but the present embodiment is not limited to these.

Figure 3:
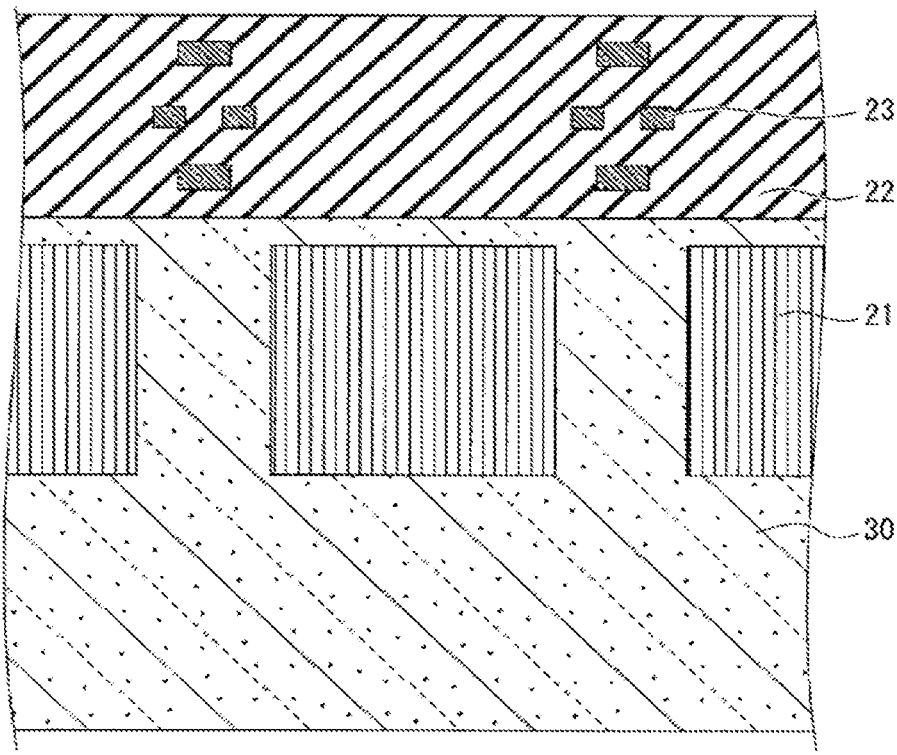
FIG. 3 is a schematic cross-sectional view illustrating the process of producing the solid-state image sensor according to one embodiment of the present invention.

A material of the wire 23 may be a metal material, an alloy containing the metal material, or the like. Examples of the metal material include aluminum, copper, and chromium. Then, by a production process suitable for the material to be used, a wire pattern with the wire 23 is formed, and thus the interlayer insulating layer 22 and the wire 23 as illustrated in FIG. 3 are formed on the semiconductor substrate 30.

Figure 4:
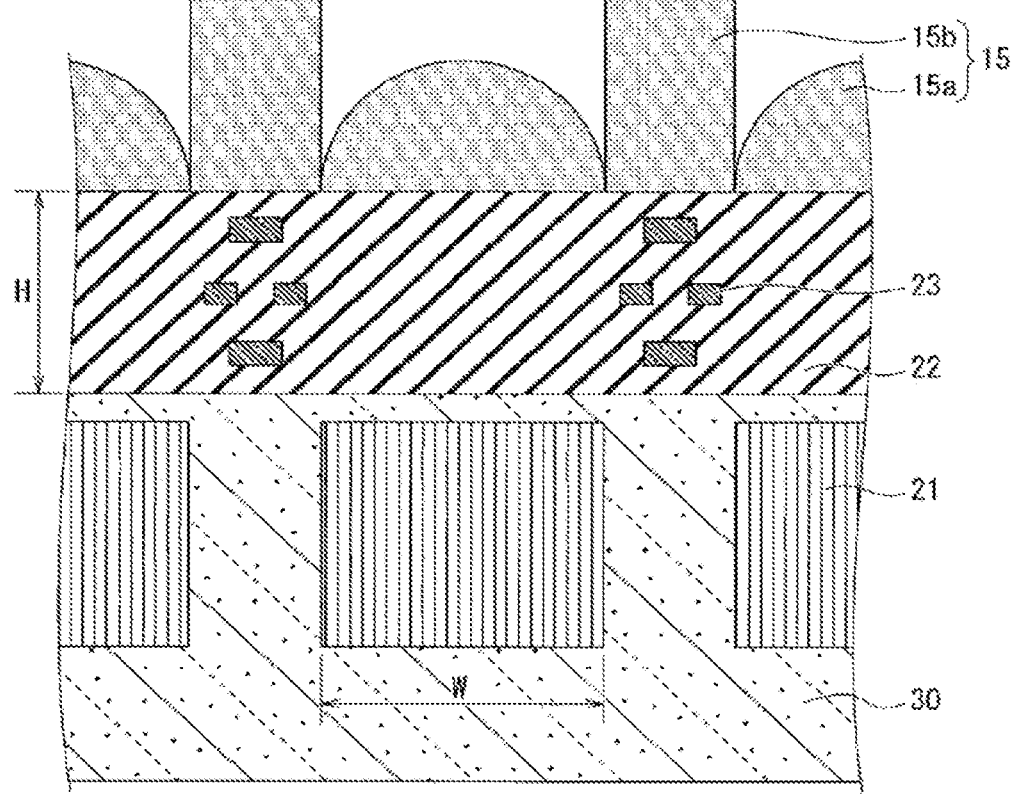
FIG. 4 is a schematic cross-sectional view illustrating the process of producing the solid-state image sensor according to one embodiment of the present invention.
Figure 5:
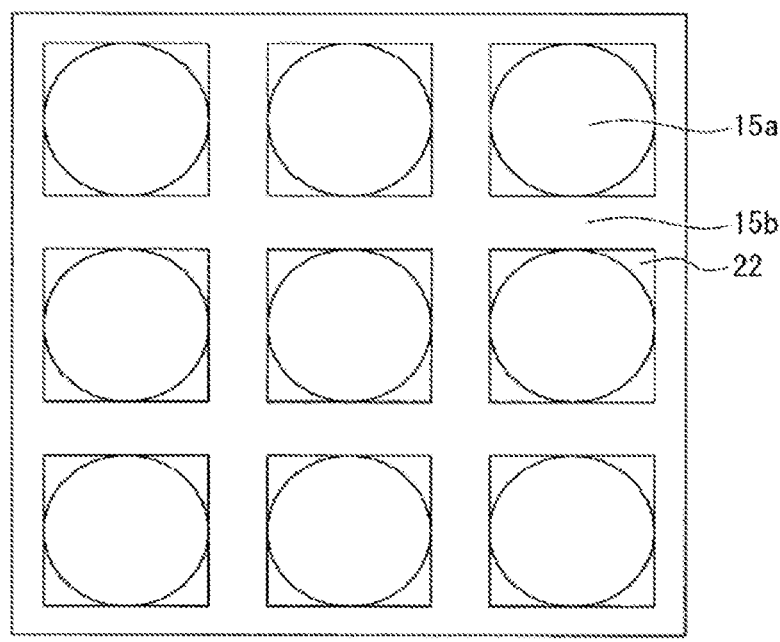
FIG. 5 is a schematic plan view illustrating the process of producing the solid-state image sensor according to one embodiment of the present invention.

Next, in order to form the light reflection structure 14 in the interlayer insulating layer 22, a photoresist 15 is applied, and is patterned as illustrated in FIGS. 4 and 5. The patterned photoresist 15 is constituted by a hemispherical pattern 15a located above the photoelectric conversion elements 21 and a rectangular pattern 15b located above the wires 23. As illustrated in a plan view in FIG. 5, the rectangular pattern 15b has a lattice shape surrounding the hemispherical patterns 15a two-dimensionally arranged.

As illustrated in FIG. 4, the hemispherical pattern 15a and the rectangular pattern 15b are not identical in height, and the heights are set according to a structure of the light reflection structure 14 intended to be formed. When H represents a thickness of the interlayer insulating layer 22 and W represents a width of the photoelectric conversion element 21, for example, in a case where the light reflection structure 14 having a hemispherical shape with a diameter the same as the width W of the photoelectric conversion element 21 is intended to be formed, a ratio of heights of the hemispherical pattern 15a and the rectangular pattern 15b needs to be set to (W/2):H.

Furthermore, in order to transfer the shape of the hemispherical pattern 15a to the interlayer insulating layer 22 at a dry etching step later, W/2 needs to be H or less.

The light reflection structure 14 preferably has a hemispherical shape that concentrates reflected incident light on a center portion of the pixel. For improvement of sensitivity to red light, however, the reflected light does not necessarily need to be concentrated in the center portion of the pixel, and only needs to reenter the photoelectric conversion element 21. In the present invention, therefore, the hemispherical pattern 15a does not need to be precisely designed to have a curved surface shape constituting part of a true sphere.

In order to form the pattern of the photoresist 15, first, a material of the photoresist 15 is applied to a surface of the interlayer insulating layer 22, and patterning is performed so that the photoresist 15 is left to form a circular cylindrical shape for each pixel. Next, by performing a thermal reflow process with respect to the patterned photoresist, the photoresist 15 is processed into a hemispherical shape to form the hemispherical pattern 15a. Then, a photoresist is applied again to form the rectangular pattern 15b surrounding the hemispherical pattern 15a. Thus, the pattern of the photoresist 15 illustrated in FIG. 4 is formed.

Alternatively, by using nanoimprint lithography or dot masking, the pattern of the photoresist 15 can be formed by performing patterning once, but the method of the present embodiment is not limited to these.

Figure 6:
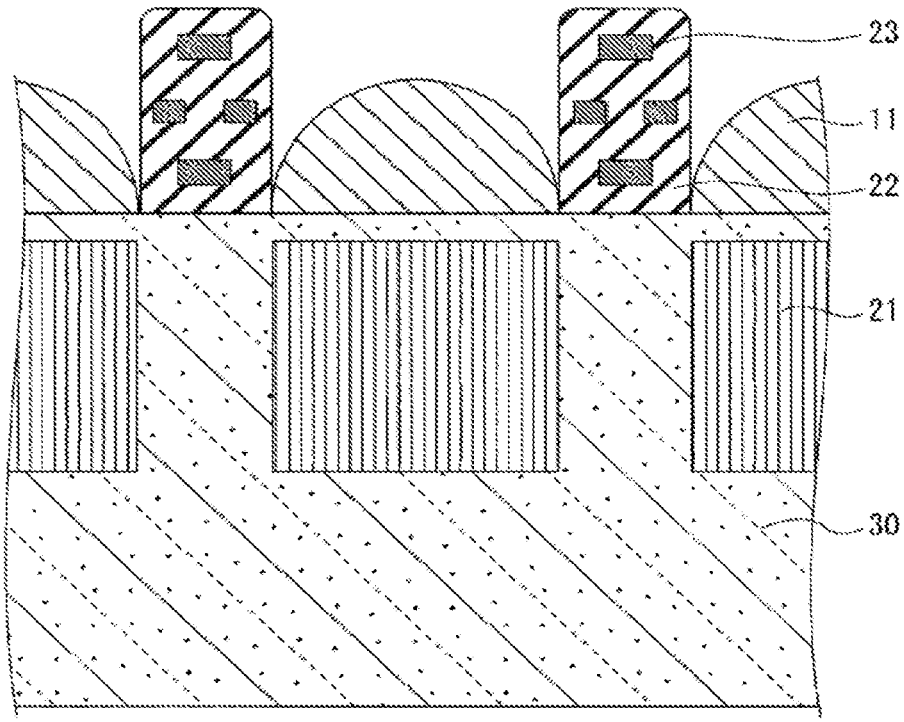
FIG. 6 is a schematic cross-sectional view illustrating the process of producing the solid-state image sensor according to one embodiment of the present invention.

Next, by performing a dry etching process using the photoresist 15 as a dry etching mask, as illustrated in FIG. 6, the shape of the hemispherical pattern 15a is transferred to the interlayer insulating layer 22. Thus, the light transmission layer 11 having a hemispherical shape is formed. Furthermore, since the rectangular pattern 15b is used as the mask during the dry etching, even after the dry etching process, the interlayer insulating layer 22 located below the rectangular pattern 15b and the wire 23 in the interlayer insulating layer 22 are protected without being etched.

Figure 7:
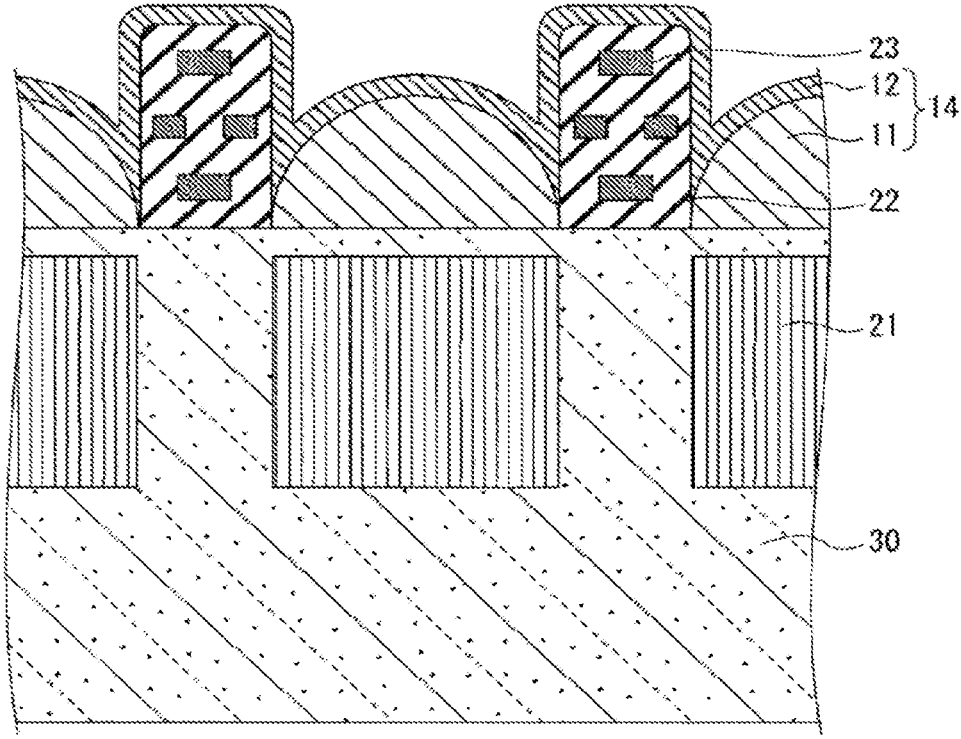
FIG. 7 is a schematic cross-sectional view illustrating the process of producing the solid-state image sensor according to one embodiment of the present invention.

Next, as illustrated in FIG. 7, the reflective metal 12 is formed on a surface of the light transmission layer 11 and on a surface of the interlayer insulating layer 22 that has been left without being dry etched. For the reflective metal 12, a metal thin film made of a material having a high reflectance such as a metal material or an alloy containing the metal material is used. Examples of the metal material include aluminum, silver, chromium, tantalum, tungsten, and titanium. Furthermore, the material of the reflective metal 12 is exposed to a high temperature in the production process later, and is thus preferably a material that is not melted by heat treatment at a temperature in the range of at least 500° C. or more and 600° C. or less. The reflective metal 12 is formed by means such as vapor deposition or sputtering.

Figure 8:
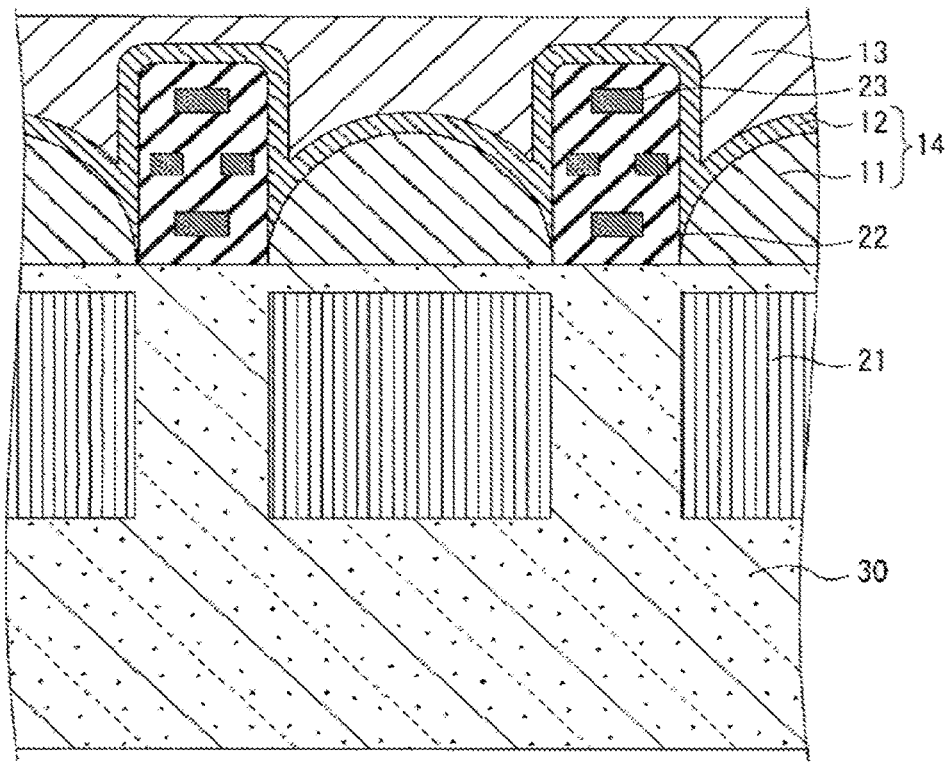
FIG. 8 is a schematic cross-sectional view illustrating the process of producing the solid-state image sensor according to one embodiment of the present invention.

Next, as illustrated in FIG. 8, by forming the flattening layer 13 on the reflective metal 12, asperities on the surface caused by processing the interlayer insulating layer 22 and the light reflection structure 14 are flattened. A material of the flattening layer 13 does not need to have transparency, but is preferably a material, such as silicon nitride or undoped silicon oxide, resistant to a high temperature environment used in a semiconductor process.

When the flattening of the asperities by forming the flattening layer 13 is insufficient, the substrate surface may be further flattened by polishing methods such as CMP (Chemical Mechanical Polishing). Through the steps described above, the light reflection structure 14 is formed on the semiconductor substrate 30.

Figure 9:
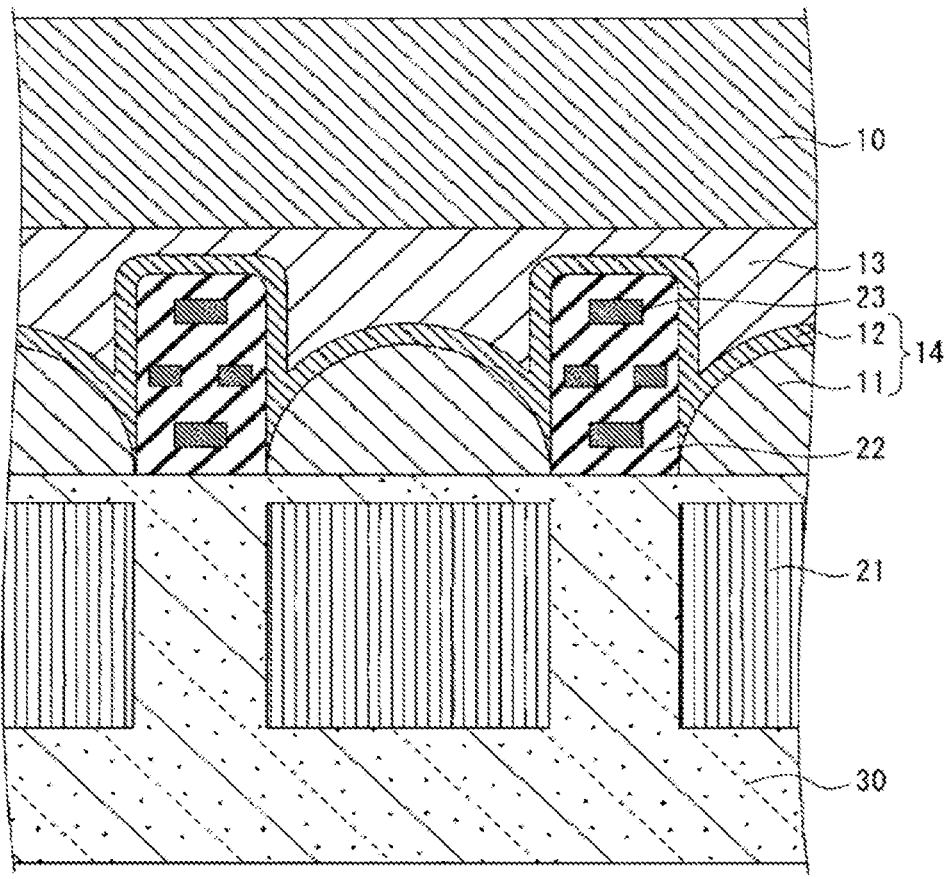
FIG. 9 is a schematic cross-sectional view illustrating the process of producing the solid-state image sensor according to one embodiment of the present invention.

Next, as illustrated in FIG. 9, the semiconductor substrate 30 is bonded to the support substrate 10 such that a bonding surface is a surface of the semiconductor substrate 30 on which the light reflection structure 14 has been formed. As a material of the support substrate 10, a quartz substrate or a p-type or n-type silicon substrate is used. The semiconductor substrate 30 can be strongly adhered to the support substrate 10 by activating, through plasma treatment or ozone treatment, the surface of the semiconductor substrate 30 on which the light reflection structure 14 has been formed or a surface of the support substrate 10, and then bonding the semiconductor substrate 30 to the support substrate 10. However, the method of bonding the semiconductor substrate 30 to the support substrate 10 is not limited to the above method.

Figure 10:
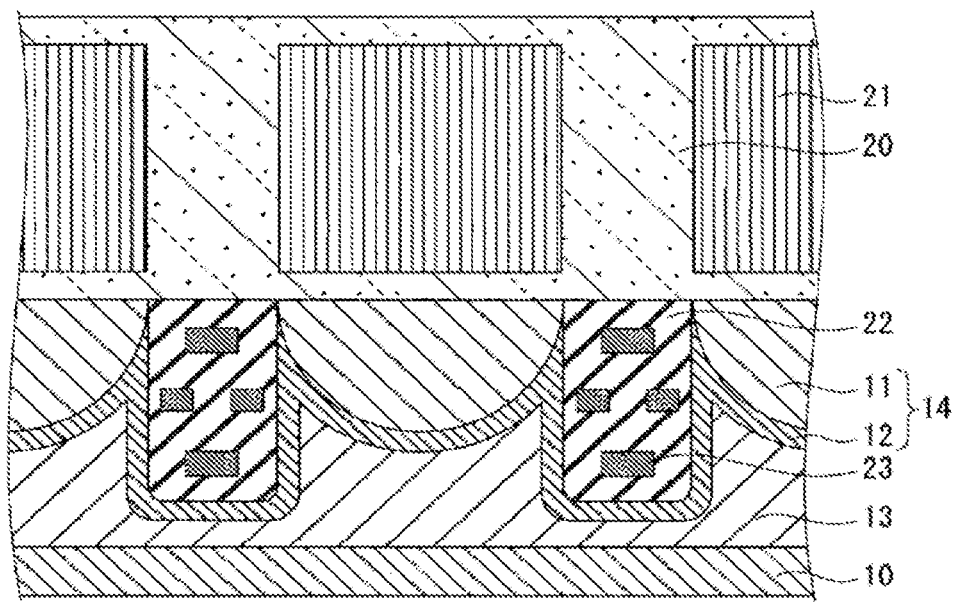
FIG. 10 is a schematic cross-sectional view illustrating the process of producing the solid-state image sensor according to one embodiment of the present invention.

Next, after the semiconductor substrate 30 is bonded to the support substrate 10, the semiconductor substrate 30 is processed to form the semiconductor layer 20. By thinning the semiconductor substrate 30 after the bonding of the semiconductor substrate 30 to the support substrate 10, as illustrated in FIG. 10, the semiconductor layer 20 is formed on the support substrate 10. FIG. 10 illustrates the light incident side on an upper side.

In order to thin the semiconductor substrate 30, first, the substrate is physically thinned by means of a grinder, and then a polishing process by a method such as CMP is performed to smooth the surface. Then, by chemically etching the substrate through wet etching or dry etching, the semiconductor substrate 30 is thinned to have an intended thickness. Thus, the semiconductor layer 20 is formed. However, the embodiments of the present invention is not limited to these.

A depletion layer in which electrons are accumulated is located at a lower portion (portion on the back surface side) of the photoelectric conversion element 21 illustrated in FIG. 10. Accordingly, if the semiconductor layer 20 has a large thickness, a distance from an electron at an upper portion of the photoelectric conversion element 21 to the depletion layer is long. In such a case, before an electron reaches a depletion layer of a pixel in which the electron has been generated, the electron may disappear by recombination or flow into an adjacent pixel, and this may cause a reduction in efficiency or color mixture. In particular, light in a short-wavelength region (a wavelength in the range of 360 nm or more and 450 nm or less) is mainly photoelectrically converted at the upper portion (portion on the light incident side) of the photoelectric conversion element 21. Thus, if the semiconductor layer 20 has a thickness of more than 3 µm, a photoelectric conversion efficiency for short-wavelength light is reduced.

On the other hand, by reducing the thickness of the semiconductor layer 20, the conversion efficiency for short-wavelength light is increased, but long-wavelength light is not sufficiently photoelectrically converted inside the photoelectric conversion element 21 and passes downward through the photoelectric conversion element 21. However, the light is reflected by the light reflection structure 14 of the solid-state image sensor of the present embodiment and reenters the photoelectric conversion element 21. In the structure of the present embodiment, therefore, when the semiconductor layer 20 has a thickness of 2 µm or more, it is possible to efficiently photoelectrically convert light in the entire visible light region. Accordingly, the semiconductor layer 20 preferably has a thickness in the range of 2 µm or more and 3 µm or less.

Figure 11:
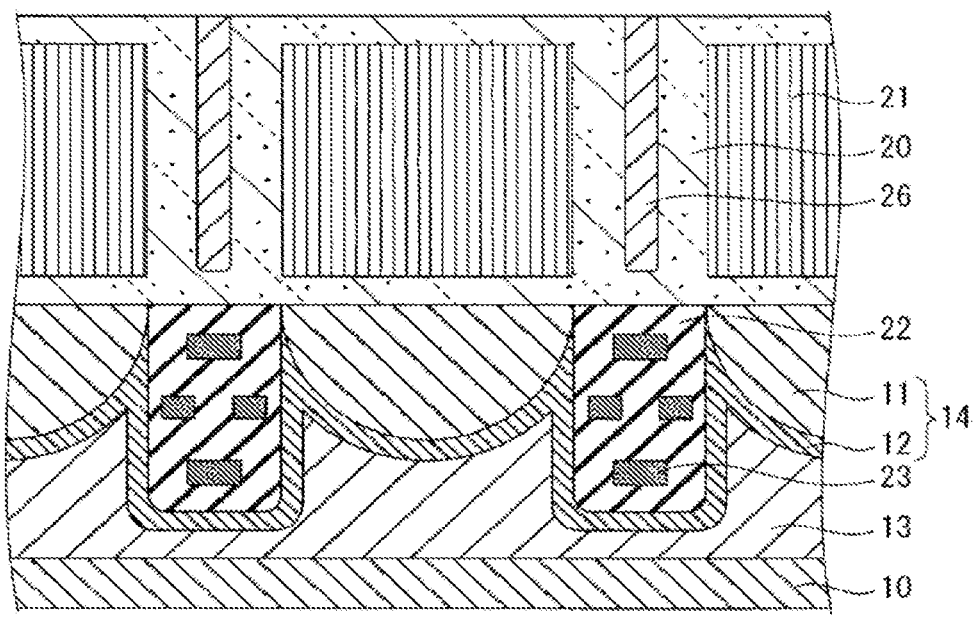
FIG. 11 is a schematic cross-sectional view illustrating the process of producing the solid-state image sensor according to one embodiment of the present invention.

Next, as illustrated in FIG. 11, the element separation wall 26 is formed between the photoelectric conversion elements 21. The element separation wall 26 is not necessarily required for driving the sensor, but the element separation wall 26 has an effect of preventing color mixture caused when light incident on the photoelectric conversion element 21 enters an adjacent pixel or an electron generated in the photoelectric conversion element 21 flows into the adjacent pixel. By using polycrystalline silicon or silicon oxide as a material of the element separation wall 26, it is possible to prevent both the incident light and the generated electron from flowing into the adjacent pixel. A DTI (Deep Trench Isolation) technique is used to form the element separation wall 26 by forming a groove having a high aspect ratio in the semiconductor layer 20 and burying the material of the element separation wall 26 in the groove.

Furthermore, many defect levels are present on a surface of the thinned semiconductor layer 20. Accordingly, if the semiconductor layer 20 is directly used to form an image sensor, for example, trapping of a generated electron by the defect level or an increase in dark state noise occurs, and thus performance of the sensor is greatly deteriorated. Thus, the surface of the semiconductor layer 20 needs to be subjected to an inactivation process. The inactivation process is performed by forming a p+ layer having high concentration on the surface of the semiconductor layer 20.

Figure 12:
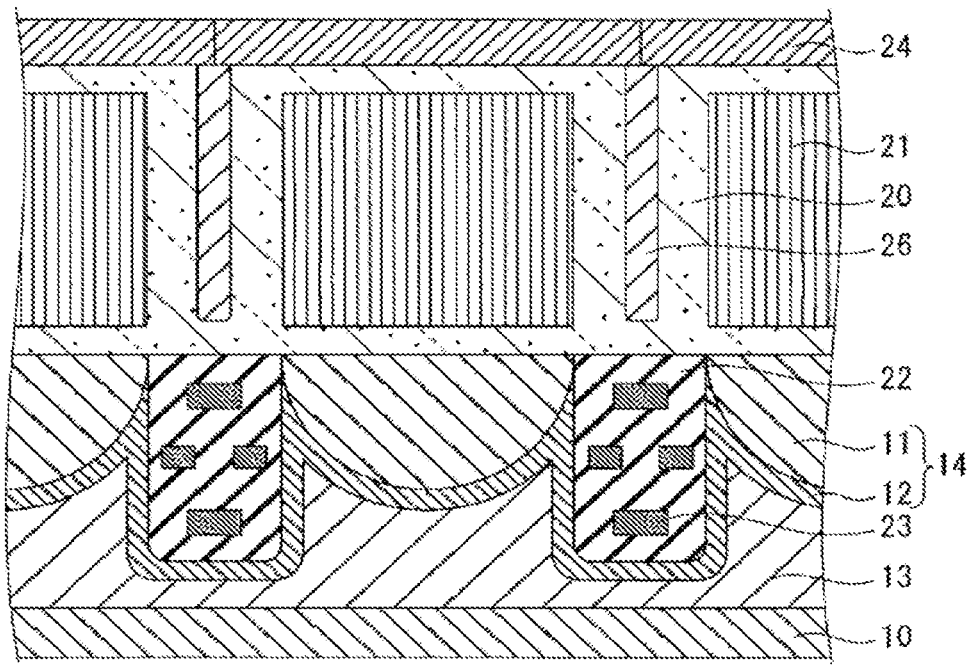
FIG. 12 is a schematic cross-sectional view illustrating the process of producing the solid-state image sensor according to one embodiment of the present invention.

Next, as illustrated in FIG. 12, a color filter 24 is formed on the semiconductor layer 20. Although not illustrated, before forming the color filter 24, an organic film having a flattening property may be formed on the semiconductor layer 20 to flatten the surface. Pattern formation for the color filter 24 may be performed by photolithography using a photosensitive resin in which a pigment is dispersed.

Alternatively, pattern processing for the color filter 24 may be performed by a method in which a non-photosensitive resin in which a pigment is dispersed is applied onto the semiconductor layer 20 or onto the flattening film formed on the semiconductor layer 20, a photoresist is further applied onto the non-photosensitive resin, a pattern is formed by photolithography, and then dry etching is performed.

A color array of the color filter 24 may be a Bayer array with three colors of red (R), green (G), and blue (B), or another RGB array, or a color filter array in which filters with colors other than RGB (e.g., white, cyan, yellow, magenta, and the like) are arranged. However, the present embodiment is not limited to these.

After the formation of the color filter 24, micro-lenses 25 are formed on the color filter 24. Thus, the solid-state image sensor of the present embodiment illustrated in FIG. 1 is obtained. The micro-lenses 25 can be formed by a method in which a photosensitive resin is applied onto the color filter 24, a gap between lenses for each pixel is formed by photolithography, and then the photosensitive resin is formed into a lens shape by thermal flow.

Alternatively, the micro-lenses 25 can be formed by a method in which a resin is applied onto the color filter 24, a photosensitive resin is applied onto the color filter 24, the photosensitive resin is formed into a lens shape by photolithography and thermal flow, and then dry etching is performed by using the photosensitive resin film having a lens shape as a sacrificial film, so that the resin formed on the color filter 24 is processed into a lens shape.

Examples

An example of the present invention will be described below, but the present invention is not limited to this.
(Formation of Photoelectric Conversion Element 21 on Support Substrate 10)

A buried photodiode to be the photoelectric conversion element 21 was formed in the semiconductor substrate 30 by a CMOS production process. Furthermore, simultaneously with the photoelectric conversion element 21, a floating diffusion layer amplifier, a transistor for charge transfer transistor selection, a reset transistor, and a source follower amplifier, which were functional elements for driving a CMOS image sensor, were formed in a pixel.

After the formation of the photoelectric conversion element 21 and the other elements, the wires 23 were formed. Furthermore, the interlayer insulating layer 22 was formed between the wires 23. The interlayer insulating layer 22 was formed by forming a film with undoped silicon oxide by atmospheric pressure CVD. The wires 23 were formed by forming an aluminum thin film by sputtering and then performing wire pattern processing by photolithography.
(Formation of Light Reflection Structure 14)

Next, in order to form the light reflection structure 14, a pattern of the photoresist 15 was formed on the interlayer insulating layer 22. First, a photosensitive resist was applied by means of a spin coater, and was then exposed and developed to form a circular cylindrical pattern. The semiconductor substrate 30 was heated by means of a hot plate at 230° C., and the patterned photosensitive resist was subjected to thermal reflow to form the hemispherical pattern 15a. Then again, a photosensitive resist was applied by means of the spin coater, and was then exposed and developed to form the rectangular pattern 15b surrounding the hemispherical patterns 15a in a parallel cross shape. Thus, the pattern of the photoresist 15 was formed.

In the present example, a width of the photoelectric conversion element 21 and a thickness of the interlayer insulating layer 22 were both 3 µm, and a dry etching condition was applied so that a dry etching selection ratio of the photoresist 15 and the interlayer insulating layer 22 was approximately 1:1. Accordingly, when the photosensitive resist was applied, a thickness of the photosensitive resist was adjusted so that the hemispherical pattern 15a had a thickness of 1.5 µm and the rectangular pattern 15b had a thickness of 3 µm after the pattern was completed.

Next, by performing a dry etching process using a mixed gas of tetrafluoromethane ($CF_4$) and oxygen ($O_2$) with respect to the semiconductor substrate 30, the interlayer insulating layer 22 was processed to form the light transmission layer 11. The photoresist 15 patterned into hemispherical shapes was etched and removed during the dry etching process. However, the hemispherical shapes of the photoresist 15 were transferred to the interlayer insulating layer 22 which was a base, and thus the light transmission layer 11 was processed into hemispherical shapes. Furthermore, the rectangular pattern of the photoresist 15 located above the portion of the interlayer insulating layer 22 in which the wires 23 were formed was also etched and removed during the dry etching process. However, the etching was ended when the light transmission layer 11 was formed, and thus the interlayer insulating layer 22 and the wires 23 below the rectangular pattern of the photoresist 15 were protected without being etched.

Then, an aluminum thin film was formed by sputtering on surfaces of the light transmission layer 11 and the interlayer insulating layer 22 that had been left without being dry etched. Thus, the reflective metal 12 was formed. Then, a film was formed of undoped silicon oxide by atmospheric pressure CVD, and after the film formation, the surface was polished by CMP to be smoothened. Thus, the flattening layer 13 was formed. Through the steps described above, the light reflection structure 14 was formed on the semiconductor substrate 30.

(Formation of Semiconductor Layer 20 on Support Substrate 10)

A surface of a silicon substrate to be the support substrate 10 was activated by performing ozone treatment. Then, the surface of the support substrate 10 was bonded to a surface of the semiconductor substrate 30 on which the flattening layer 13 was formed. After the support substrate 10 was bonded to the semiconductor substrate 30, the semiconductor substrate 30 was ground by means of a grinder, and then the semiconductor thin film surface was polished by CMP to be smoothened.

Then, by performing a wet etching process using a mixed solution of potassium hydroxide and tetramethyl ammonium hydroxide (TMAH), the semiconductor substrate 30 was thinned to form the semiconductor layer 20. After the solid-state image sensor was formed, a cross section of the solid-state image sensor was observed by means of a scanning electron microscope S4800 produced by Hitachi High-Technologies Corporation, and the semiconductor layer 20 had a thickness of 2.5 µm.

(Production of Solid-State Image Sensor)

An inactivation process was performed by doping a p+ layer having a maximum carrier concentration of $1e^{19}/cm^3$ on the surface of the semiconductor layer 20. After the inactivation process with respect to the surface, a groove having a width of 200 nm and a depth of 2 µm was formed by dry etching at a boundary portion of each pixel in the semiconductor layer 20. Then, undoped silicon oxide was buried in the groove by atmospheric pressure CVD. Furthermore, the semiconductor thin film surface was polished by CMP to be smoothened. Thus, the element separation wall 26 was formed in the semiconductor layer 20.

Next, the color filter 24 was formed on the semiconductor layer 20 by using three types of photosensitive resins containing respective green, blue, and red so that the color filter 24 had a Bayer array. The photosensitive resins containing the pigments were applied by a spin coating method, and were then exposed and developed to form patterns for the respective colors.

After the formation of the color filter 24, a non-photosensitive resin was applied onto the color filter 24, and was then baked to form a flattening film. Next, a positive photosensitive resin was applied onto the flattening film by a spin coating method, and a gap between lenses for each pixel was formed by photolithography. Then, by performing heat treatment, the photosensitive resin was reflowed to have a lens shape. Thus, the micro-lenses 25 were formed. The lens shape of the micro-lenses 25 was designed so that when light in a visible light region was incident on the solid-state image sensor, the light was condensed near a center of the photoelectric conversion element 21.

After the formation of the micro-lenses 25, subsequent processes such as formation of a protective film, dicing of the support substrate, and wire bonding were performed to complete the solid-state image sensor.

Figure 13:
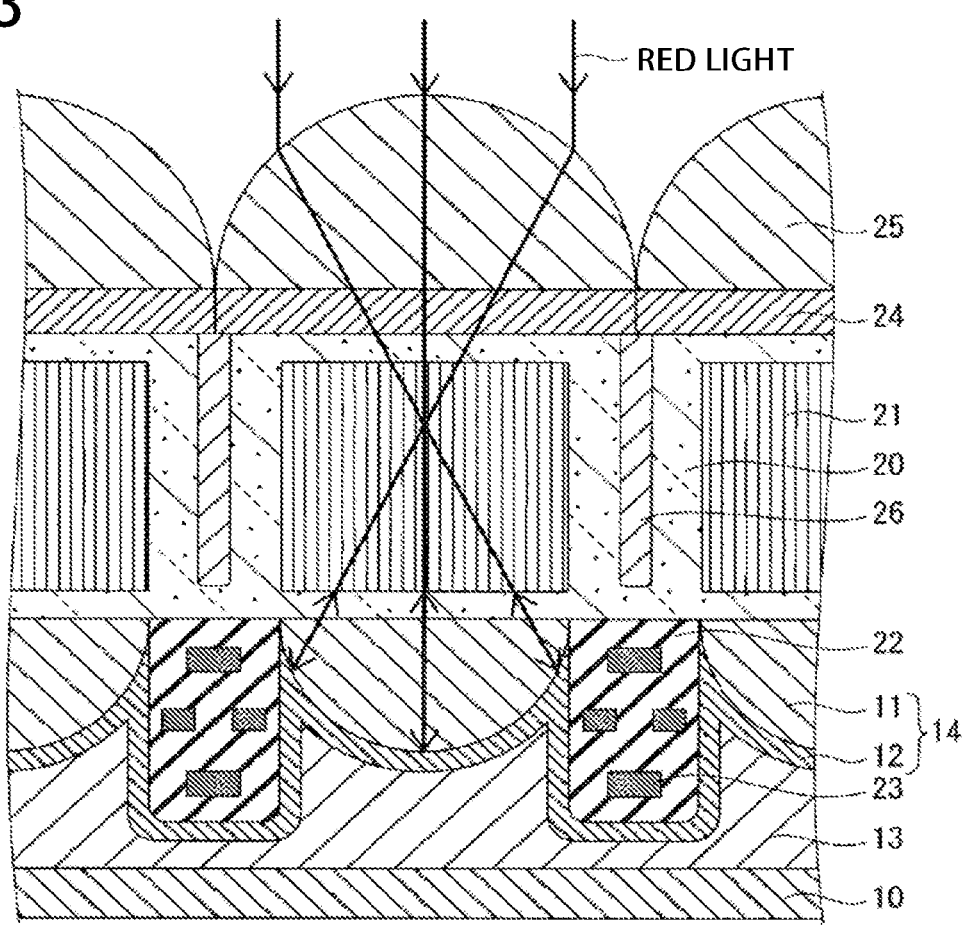
FIG. 13 is a schematic cross-sectional view illustrating an effect of the solid-state image sensor according to one embodiment of the present invention.

Behavior of light incident on the solid-state image sensor produced according to the structure of the present example will be described with reference to FIG. 13. Light that has perpendicularly entered the solid-state image sensor is refracted in the micro-lenses 25, and is condensed toward the center of the photoelectric conversion element 21. Light having a short wavelength is photoelectrically converted on the surface of the photoelectric conversion element 21 or inside the photoelectric conversion element 21, and forms an electron-hole pair. However, red light mostly passes through the semiconductor layer 20 without being photoelectrically converted, and is reflected by the reflective metal 12 in the light reflection structure 14.

Furthermore, since the light transmission layer 11 and the reflective metal 12 that covers the light transmission layer 11 each have a hemispherical shape, not only light that has vertically entered from a vertex of the micro-lens 25 but also light that has been condensed in the photoelectric conversion element 21 and then has obliquely entered the light reflection structure 14 is efficiently reflected toward the center of the photoelectric conversion element 21 and reenters the photoelectric conversion element 21.

In order to verify a sensitivity improvement effect of the solid-state image sensor according to the present example, a quantum efficiency of the solid-state image sensor produced according to the present example was measured. A quantum efficiency QE of the solid-state image sensor can be represented by the following equation:

$$QE=Ne/Np,$$

where Np is the number of photons incident on a pixel per unit time, and Ne is the number of signal electrons generated in the pixel. In order to obtain the number Ne of signal electrons, the solid-state image sensor was connected to a dedicated drive circuit substrate. Then, the solid-state image sensor was irradiated with incident light from a wavelength variable light source, and a sensor output DN (Digit Number) was measured for each wavelength. Then, the number Ne of signal electrons was calculated by the following equation.

$$Ne = DN \times C$$

In the above equation, C represents a conversion factor (Electron Number/Digit Number).

On the other hand, in order to obtain the number Np of photons incident on a pixel per unit time, first, a photodiode available on the market whose spectral sensitivity was known was irradiated with incident light, and a photoelectric current for each wavelength was measured to obtain an amount of light W (W/cm$^2$) for each wavelength. Then, the number Np of photons incident on a pixel per unit time was calculated by the following equation.

$$Np = W \times s \times \lambda \times t/(h \times c)$$

In the above equation, s represents an area (cm$^2$) of a pixel of the solid-state image sensor, $\lambda$, represents a wavelength (m) of the incident light, t represents an irradiation time (sec) of the incident light, h represents the Planck constant ($6.6 \times 10^{-34}$ J·sec), and c represents a speed ($3.0 \times 10^8$ m/sec) of light in a vacuum.

When the quantum efficiency of the solid-state image sensor produced in the present example was measured by the above method, the quantum efficiency for incident light in a red region (600 to 650 nm) was 61.9%.

For comparison, a solid-state image sensor having the same structure as the present example except for having no light reflection structures 14 at a lower portion of the semiconductor layer 20 was produced, and the quantum efficiency was measured under the same measurement condition as the solid-state image sensor of the present example. In this case, the quantum efficiency for incident light in the red region (600 to 650 nm) was 50.9%, and thus sensitivity was reduced as compared with the present example.

The reduction in sensitivity was presumably caused by the following reason. That is, since the solid-state image sensor produced for comparison had no light reflection structures 14 at the lower portion of the semiconductor layer 20, red light that was not photoelectrically converted in the semiconductor layer 20 passed through the wire layer toward the support substrate 10.

The above validation showed that the solid-state image sensor having the structure of the present example had good sensitivity to red light.

The present application addresses the following. Patent Literature 1 has a problem in which the formed metal reflector is flat and thus an angle of light reflected by the metal reflector is uncontrollable, and this prevents the light from efficiently reentering the photoelectric conversion element. Furthermore, Patent Literature 2 has a problem in which a functional element needs to be formed on both front and back sides of the substrate, and this makes handling of the substrate difficult, for example, by disabling the substrate from being directly disposed on a stage during formation of a back side element after formation of a front side element or during packaging after formation of elements on the both sides.

The present invention has an aspect of providing a solid-state image sensor that has good red light sensitivity to efficiently reflect red light passing through a photoelectric conversion element toward the photoelectric conversion element and permits easy substrate handling during formation of the sensor.

A solid-state image sensor according to an aspect of the present invention is summarized in that: a plurality of photoelectric conversion elements are two-dimensionally arranged in a semiconductor layer; a support substrate is provided on a surface side opposite to a light incident side of the semiconductor layer; an interlayer insulating layer and a plurality of light reflection structures are provided on a surface side of the support substrate which faces toward the semiconductor layer; the light reflection structures include a light transmission layer and a reflective metal that covers a surface of the light transmission layer opposite to a surface facing the semiconductor layer; the light reflection structures are provided at positions facing the respective photoelectric conversion elements; a surface of the reflective metal on a side of the photoelectric conversion elements is a concave curved surface facing the photoelectric conversion elements; and the interlayer insulating layer is located between adjacent ones of the light reflection structures.

In the solid-state image sensor which is an aspect of the present invention, in light incident on the photoelectric conversion element, red light that has not been absorbed by the photoelectric conversion element and has passed through the semiconductor layer is reflected by the light reflection structure provided on a back surface side of the photoelectric conversion element, and efficiently reenters the photoelectric conversion element. Thus, this aspect of the present invention has good red light sensitivity.

Furthermore, since the semiconductor layer is supported by the support substrate and the light reflection structures are located between the semiconductor layer and the support substrate, no functional elements for reflecting incident light need to be formed on a back surface of the support substrate. Thus, the substrate may be directly disposed on a stage during a production process, and this facilitates handling of the substrate during formation of the sensor.

The scope of the present invention is not limited to the illustrative embodiment illustrated and described above, but also includes all embodiments that yield effects equivalent to the effects intended by the present invention. Furthermore, the scope of the present invention is not limited to a combination of features of the invention defined by the claims, but may be defined by any desired combination of specific features among all the disclosed features.

Furthermore, the entire description of Japanese Patent Application No. 2016-235840 (filed on Dec. 5, 2016) from which the present application claims the benefit of priority is incorporated herein by reference.

REFERENCE SIGNS LIST

10: Support substrate
11: Light transmission layer
12: Reflective metal
13: Flattening layer
14: Light reflection structure
15: Photoresist
15a: Hemispherical pattern
15b: Rectangular pattern
20: Semiconductor layer
21: Photoelectric conversion element
22: Interlayer insulating layer
23: Wire
24: Color filter
25: Micro-lenses
26: Element separation wall
30: Semiconductor substrate Obviously, numerous modifications and variations of the present invention are possible in light of the above teachings. It is therefore to be understood that within the scope of the appended claims, the invention may be practiced otherwise than as specifically described herein.

What is claimed is:

1. A solid-state image sensor, comprising:
   a semiconductor layer having a light incident side;
   a support substrate positioned on an opposite side of the light incident side of the semiconductor layer;
   a plurality of photoelectric conversion elements formed two-dimensionally in the semiconductor layer;
   a plurality of light reflection structures formed between the semiconductor layer and the support substrate such that the light reflection structures face the photoelectric conversion elements, respectively;
   an interlayer insulating layer formed between the semiconductor layer and the support substrate such that the insulating layer is filling spaces formed between adjacent ones of the light reflection structures; and
   a flattening layer surrounding the interlayer insulating layer, wherein the light reflection structures include a light transmission layer and a reflective metal film covering a surface of the light transmission layer and a surface of the interlayer insulating layer in the spaces between the adjacent ones of the light reflection structures on a support substrate side opposite to a semiconductor layer side such that the reflective metal film of the light reflection structures has a plurality of concave curved surfaces facing the photoelectric conversion elements, respectively.

2. The solid-state image sensor according to claim 1, wherein each of the light reflection structures has a hemispherical shape having a plane on a side facing the semiconductor layer.

3. The solid-state image sensor according to claim 1, wherein the support substrate comprises quartz or silicon.

4. The solid-state image sensor according to claim 2, wherein the support substrate comprises quartz or silicon.

5. The solid-state image sensor according to claim 1, wherein the support substrate comprises quartz.

6. The solid-state image sensor according to claim 1, wherein the support substrate comprises silicon.

7. The solid-state image sensor according to claim 2, wherein the support substrate comprises quartz.

8. The solid-state image sensor according to claim 2, wherein the support substrate comprises silicon.

9. The solid-state image sensor according to claim 1, wherein the reflective metal film has a plurality of hemispherical portions having the plurality of concave curved surfaces, respectively portion having the concave curved surface.

10. The solid-state image sensor according to claim 1, wherein the light transmission layer facing the plurality of concave curved surfaces of the reflective metal film has a plurality of hemispherical portions, respectively.

11. The solid-state image sensor according to claim 9, wherein the light transmission layer facing the plurality of concave curved surfaces of the reflective metal film has a plurality of hemispherical portions, respectively.

12. The solid-state image sensor according to claim 1, wherein the reflective metal film is formed such that each of the concave curved surfaces forms a partial elliptical curve.

13. The solid-state image sensor according to claim 1, wherein the semiconductor layer has a thickness in a range of 2 μm to 3 μm.

14. The solid-state image sensor according to claim 1, further comprising:
   a plurality of element separation walls formed such that each of the element separation walls is positioned between adjacent ones of the photoelectric conversion elements.

15. The solid-state image sensor according to claim 14, wherein the plurality of element separation walls comprises polycrystalline silicon.

16. The solid-state image sensor according to claim 14, wherein the plurality of element separation walls comprises silicon oxide.

17. The solid-state image sensor according to claim 1, further comprising:
   wherein the flattening layer is formed between the light reflection structures and the support substrate.

18. The solid-state image sensor according to claim 9, wherein the flattening layer is formed between the light reflection structures and the support substrate such that the flattening layer covers the plurality of hemispherical portions of the reflective metal film.

19. The solid-state image sensor according to claim 17, wherein the flattening layer comprises silicon nitride.

20. The solid-state image sensor according to claim 17, wherein the flattening layer comprises undoped silicon oxide.

* * * * *